(12) United States Patent
Voelkel et al.

(10) Patent No.: US 6,505,270 B1
(45) Date of Patent: Jan. 7, 2003

(54) CONTENT ADDRESSABLE MEMORY HAVING LONGEST PREFIX MATCHING FUNCTION

(75) Inventors: Eric H. Voelkel, Ben Lomond, CA (US); Jayan Ramankutty, Fremont, CA (US)

(73) Assignee: Lara Technology, Inc., San Jose, CA (US)

( * ) Notice: Subject to any disclaimer, the term of this patent is extended or adjusted under 35 U.S.C. 154(b) by 0 days.

(21) Appl. No.: 09/347,489

(22) Filed: Jul. 2, 1999

(51) Int. Cl.[7] .............................................. G06F 12/00
(52) U.S. Cl. ........................ 711/108; 712/224; 365/49
(58) Field of Search .............................. 711/108; 712/5, 712/224; 710/49; 365/49–50

(56) References Cited

U.S. PATENT DOCUMENTS

| | | |
|---|---|---|
| 3,675,211 A | 7/1972 | Raviv |
| 4,791,606 A | 12/1988 | Threewitt et al. |
| 4,845,668 A | 7/1989 | Sano et al. |
| 4,928,260 A | 5/1990 | Chuang et al. |
| 4,975,873 A | 12/1990 | Nakabayashi et al. |
| 5,014,195 A | 5/1991 | Farrell et al. |
| 5,383,146 A | 1/1995 | Threewitt |
| 6,081,440 A | * 6/2000 | Washburn et al. ............ 365/49 |
| 6,144,574 A | * 11/2000 | Kobayashi et al. .... 365/189.07 |

OTHER PUBLICATIONS

McAuley, A. and Francis, P., "Fast Routing Table Lookup Using CAMs," *Proceedings IEEE INFOCOM*, 1993, pp. 1382–1391.

Gupta et al., "Routing Lookups in Hardware at Memory Access Speeds," *Proceedings of the IEEE INFOCOM*, 1998.

* cited by examiner

*Primary Examiner*—Matthew Kim
*Assistant Examiner*—Matthew D Anderson
(74) *Attorney, Agent, or Firm*—Bradley T. Sako

(57) ABSTRACT

A CAM cell array (100) that can provide a longest prefix matching operation without necessarily requiring data values to be stored in a particular order. A comparand value can be applied to a CAM cell array (100) to generate ternary match indications. The mask/prefix data values of ternary match indications can be combined to generate a longest prefix value. The longest prefix value can be compared with the mask/prefix data values of the ternary match indications to indicate a data value having a longest prefix match with the comparand value.

20 Claims, 8 Drawing Sheets

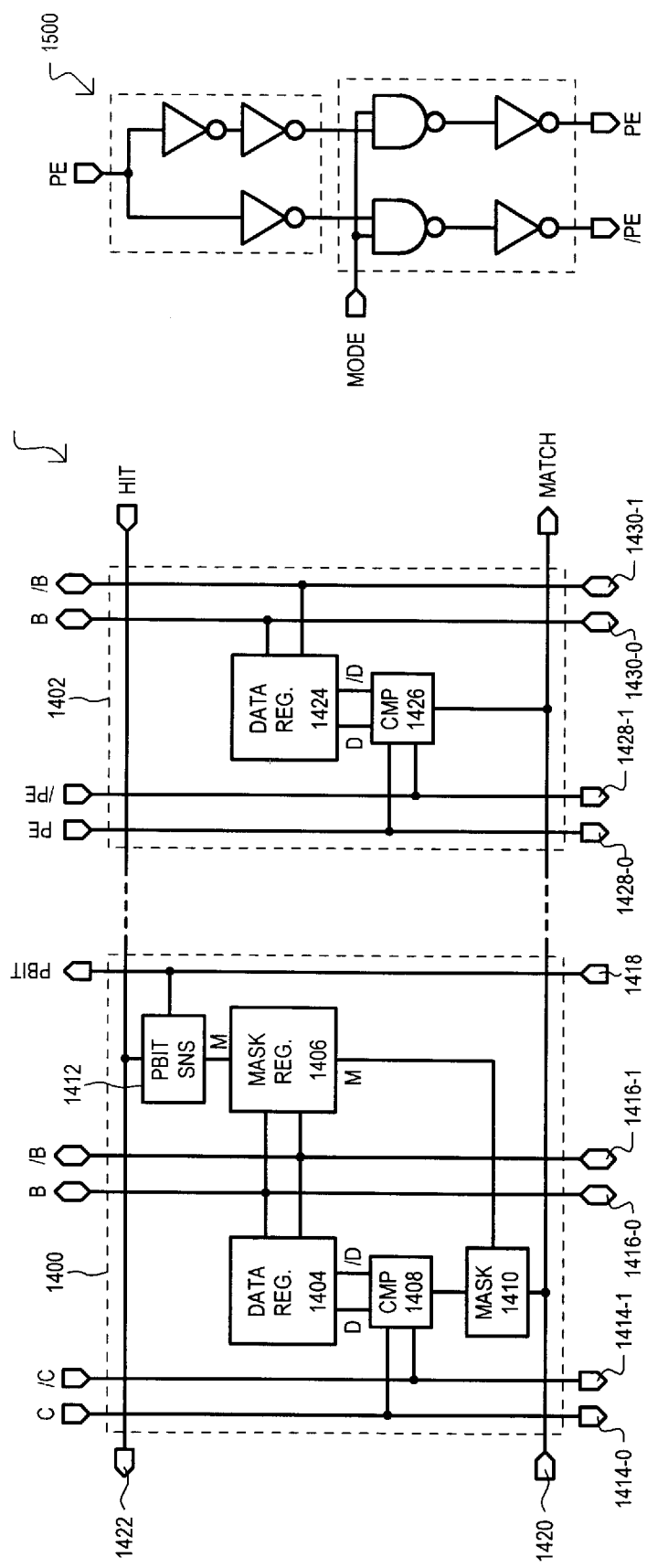

CONTENT ADDRESSABLE MEMORY HAVING LONGEST PREFIX MATCHING FUNCTION

TECHNICAL FIELD

The present invention relates generally to content addressable memories (CAMs) and more particularly to a novel CAM architecture that allows for a longest prefix matching function.

BACKGROUND OF THE INVENTION

Information network systems continue to proliferate. Typically network data is transferred in data structures referred to as "packets." A packet can travel through network according to information included in a portion of the packet referred to as a "header." Network switches and/or routers can receive packets, extract information from the packet header, and process the packet according to the extracted information. Network header information can establish, to name just a few possible examples, the destination of a packet and/or the manner in which a packet should be transmitted.

Packet routing and/or switching typically utilizes a matching function. In a matching function, a header field will be compared to a number of entries. In the event the field (or a portion of the field) matches an entry, a match indication will be generated. The match indication can be used to generate particular processing information for the packet.

Routing and switching functions can be performed by general-purpose processors that run a routing algorithm. Such an approach can result in limited throughput of data packets, be expensive in terms of component cost, and require considerable area to implement when implemented as one or more integrated circuits.

One way to address the need for faster routers is to fabricate an integrated circuit that is specialized to perform routing/switching tasks. Such application specific integrated circuits (ASICs) are designed to perform particular routing functions such as a matching function in conjunction with a random access memory (RAM). Unfortunately, because ASICs are custom manufactured products, they can also be expensive to manufacture.

One type of device that is particularly suitable for matching functions is a content addressable memory (CAM) (also referred to as an "associative memory"). A CAM can include a number of data storage locations, each of which can be accessed by a corresponding address. The order in which the data values are stored varies according to the type of CAM. As just one example, in a typical "binary" CAM, data can be stored in the first available "empty" location. Empty locations can be distinguished from "full" (or valid) locations by a status bit associated with each storage location.

Valid locations in a binary CAM can be addressed according to the contents (data values) that they store. In a typical binary CAM matching function, a comparand value (which can be a header field or a portion thereof) can be loaded into a comparand register. The comparand value can then be compared to the data values within each valid location of the conventional binary CAM. In the event the value within the comparand register matches a value of a storage location, a match signal for the matching storage location will be generated. In the event there is more than one match, one match from the multiple matches may be selected according to predetermined priority criteria. The match indication can then be used to access other information (such as routing or packet processing information, as just two examples).

By providing for the simultaneous comparison of a comparand word value (a row of comparand bit values) with a number of data words, a rapid match function can be accomplished with a binary CAM. One drawback to conventional binary CAMs is that matching functions are typically performed on data values having a fixed number of bits. Unfortunately, many routing and switching functions can require matching a comparand value to data values having variable bit lengths.

An example of longest prefix matching operation will be described below. Two data values (data0 and data1) are set forth. The data values (data0 and data1) are binary values having portions that can be compared to a comparand value (shown as either a 0 or 1). In addition, the data values (data0 and data1) have portions that do not have to be matched. These "non-match" portions are represented by a series of Xs. It is understood that each X could be a 0 or 1, but is represented by an X because the digit should not be compared with a comparand value.

| | | | | |
|---|---|---|---|---|
| 11110000 | 10XXXXXX | XXXXXXXX | XXXXXXXX | (data 0) |
| 11110000 | 10010101 | 100XXXXX | XXXXXXXX | (data 1) |

For the example of the data values set forth above, if the following comparand value is applied:

| | | | | |
|---|---|---|---|---|
| 11110000 | 10010101 | 10010000 | 11010001 | (comparand). |

Both data values can result in a match indication. It is preferred that the data 1 value match indication have priority as it provides the longest prefix match.

One type of device that can be particularly suitable for longest prefix matching is a "ternary" or "tertiary" CAM. In a conventional ternary CAM, a mask bit is provided for each data bit. When the mask bit has a first predetermined value (a logic low, for example) its corresponding data bit will be masked from a compare operation. When a data bit is masked, it will not be compared with an applied comparand value. Ternary CAM entry values are set forth below for the two examples previously described.

| | | | | |
|---|---|---|---|---|
| 11110000 | 10XXXXXX | XXXXXXXX | XXXXXXXX | (data 0) |
| 11111111 | 11000000 | 00000000 | 00000000 | (mask 0) |
| 11110000 | 10010101 | 100XXXXX | XXXXXXXX | (data 1) |
| 11111111 | 11111111 | 11100000 | 00000000 | (mask 1) |

To better understand the present invention, and to more clearly distinguish the described embodiments from conventional CAM approaches, a conventional ternary CAM is cell is set forth in FIG. 16. The conventional ternary CAM cell is designated by the general reference character 1600, and is shown to include data register 1602, a compare circuit 1604, a mask register 1606, and a mask circuit 1608. Data values can be entered into the data register 1602 by placing data values on a bit line pair (B and /B) and activating a data word line DWL. Similarly, mask values can be entered into the mask register 1606 by placing data values on a bit line pair (B and /B) and activating a mask word line MWL. It is understood that the word lines (DWL and MWL) can be commonly coupled to a row of CAM cells and the bit line pair (B and /B) can be commonly coupled to a column of CAM cells.

The compare circuit 1604 can receive the data value stored within the data register 1602 by way of complementary data lines D and /D and a complementary comparand values by way of compare lines C and /C. The compare circuit 1604 compares the data value and comparand value, and in the event the values are different, activates a match indication on match line M. In the particular conventional example of FIG. 16, the compare circuit 1604 is an exclusive OR (XOR) or exclusive NOR (XNOR) circuit.

Unlike a conventional binary CAM cell, which would couple comparison results of a compare circuit directly to a match line, in the conventional ternary CAM cell 1600, comparison results can be masked by the mask circuit 1608. In the event the mask register 1606 includes an active mask data bit (M), the mask circuit 1608 can prevent a comparison result from affecting the match line "MATCH."

FIG. 17 illustrates an example of a conventional register that may be used in a CAM (as item 1602 or 1606 in FIG. 16, as just one example). The register is designated by the general reference character 1700. Complementary stored data values stored within register 1700 are provided at data nodes 1702-0 and 1702-1. Data values can be set within the register 1700 by driving a bit line pair (B and /B) to complementary data values and activating a corresponding word line WL.

FIG. 18 sets forth a conventional compare circuit 1800 that may be used in a CAM (as item 1604 in FIG. 16, as just one example). The compare circuit 1800 can receive complementary data values (D and /D) and complementary comparand values (C and /C). An indication node 1802 can be precharged to a high logic level at the beginning of a compare operation. A data value (D and /D) and comparand value (C and /C) can then be applied to the compare circuit 1800. In the event the data value (D and /D) is different form the comparand value (C and /C), the indication node 1802 will be discharged to a low logic level (VSS). In the event the data value (D and /D) matches the comparand value (C and /C), the indication node 1802 can remain charged, indicating a match condition. The indication node 1802 can be common to a number of CAM cells of the same row. Thus, an indication node 1802 that remains precharged after a match operation can indicate a match between a row of comparand values and a row of data values (i.e., function as a match line).

A conventional mask circuit (such as item 1608 of FIG. 16) can be formed with an insulated gate field effect transistor (IGFET) having a gate connected to mask value M (or inverse mask value /M).

In the operation of a conventional ternary CAM, a comparand word value can be applied to multiple data word values, each of which can be masked at the bit level. In the event multiple matches exist, the match having the longest prefix can be given priority. Conventionally, priority can be established by placing the data values within the ternary CAM in a predetermined order. As just one example, in a ternary CAM having data locations that start with 0 and end with "n", data values can be stored in order of prefix length. Thus, a match corresponding to the lowest data location will represent the longest prefix match. Alternatively, a processor system, or the like, can maintain a record of the prefix lengths for each entry, and determine priority accordingly. In any event, for longest prefix matching operations, ternary CAM entries must be maintained in a predetermined order and/or a record can be maintained of prefix lengths according to location. This can result in complex data value management systems that can be expensive and/or time consuming to implement.

The need to maintain a particular order to ternary CAM entries can have a considerable impact on network and switch operations. Every time a new entry is entered into a conventional ternary CAM (a route table is "updated"), the order of data values may have to be rearranged. For example, for a conventional ternary CAM where data values are ordered according to prefix length, when a new data value is entered, those data values having smaller prefixes will have to be shifted down. Further, many routers and/or network switches can include a memory that mirrors the ternary CAM value entries. Such a mirroring memory will also have to be updated. Thus, the updating of routing tables can consume valuable time due to the large number of data values that have to be moved. In some high-throughput router/switches, hundreds of such updates can occur per second.

It would be desirable to arrive at some sort of approach that could not only provide a longest prefix matching function, but could also be capable of reducing the time required to update data values (such as a routing table) in a longest prefix match system.

SUMMARY OF THE INVENTION

According to one embodiment of the present invention, a novel content addressable memory (CAM) can provide a longest prefix matching operation that does not necessarily require the data values to be stored in a particular order. A longest prefix matching operation can include a ternary match operation in which a comparand value is applied to data values having corresponding mask values. The ternary match operation may result in multiple match results of various prefix lengths. The mask data from the match results can be used to indicate a longest prefix value. The longest prefix value can be compared to the mask data of the multiple match results to indicate a longest prefix match.

According to one aspect of an embodiment, the novel CAM can include CAM cells arranged in an array having rows and columns. Each CAM cell can store a mask bit. A longest prefix bit value can be compared to the mask bit values of the same column.

According to another aspect of an embodiment, the CAM cells can include a data compare circuit that can compare a comparand value to a stored data bit value, and a mask compare circuit that can compare a stored mask data bit value to a longest prefix bit value.

According to another aspect of an embodiment, each row of CAM cells can further include data CAM cells and encoded prefix/mask data CAM cells. Data CAM cells can compare a stored data bit value to a comparand bit value according to a stored mask bit value. Encoded prefix/mask data CAM cells can store encoded data that represents the mask bit values of the data CAM cells within its row. Prefix/mask data from ternary match results can be used to generate an encoded longest prefix value. The encoded longest prefix value can be compared to the prefix/mask data CAM cells of the multiple match results to indicate a longest prefix match.

According to another aspect of an embodiment, in a ternary mode of operation, the mask data of match results can be detected by "prefix" bit lines disposed in the column direction.

According to another aspect of an embodiment, prefix bit lines can also function as data bit lines. Data bit lines can be used to read (or write) a data bit and/or a mask value bit from (or into) a CAM cell.

According to another aspect of the above embodiment, a novel CAM cell can be coupled to a match line common to a row of CAM cells and a prefix bit line common to a column of CAM cells. A CAM cell can provide mask data by driving its prefix bit line toward a predetermined logic value when its mask bit is inactive and its match line is active.

According to another aspect of the above embodiment, prefix bit lines can be arranged as "wire-OR" (or "wire-NOR") circuits. A prefix bit line can be precharged to one logic level. Each CAM cell can include a prefix bit detect circuit. Each prefix bit detect circuit can connect its prefix bit line to a second logic level by a first controllable impedance path and a second controllable impedance path arranged in series with one another. The first controllable impedance path can be controlled by a "hit" line common to a row of CAM cells that is activated by a match indication for the row of CAM cells. The second controllable impedance path can be controlled by the mask bit of the CAM cell.

According to another aspect of an embodiment, each novel CAM cell can be coupled to a match line. The novel CAM cells can include a mask data compare circuit having a discharge (or charge) path that is controlled by a comparison result between a data bit and a longest prefix value bit. The longest prefix value bit can be common to at least a column of CAM cells.

According to another aspect of an embodiment, the CAM includes CAM cells arranged into a number of columns. The CAM cells of the same column can receive complementary longest prefix bit values. Global masks can be applied to the CAM cells on a column-wise basis by driving the complementary longest prefix bit values of the column to the same logic level.

According to another aspect of an embodiment, the CAM can include multiple arrays of CAM cells. The mask data of the match results from multiple arrays can be combined to indicate the length of the longest prefix value for all arrays.

BRIEF DESCRIPTION OF THE DRAWINGS

FIG. 14 is a block diagram of a data CAM cell and a mask CAM cell that may be used in the second embodiment.

FIG. 15 is a schematic diagram of a global encoded prefix/mask arrangement according to one embodiment.

DETAILED DESCRIPTION OF THE EMBODIMENTS

Various embodiments of the present invention will now be described with reference to a number of diagrams. The embodiments include a novel content addressable memory (CAM) array that can be used in longest prefix matching operations on data values that do not necessarily have to be stored in a particular order. With such an arrangement, the data values do not have to be shifted when new data values are entered. This can greatly reduce system complexity and overhead that are often dedicated to maintaining data values in a particular order.

Figure 1:
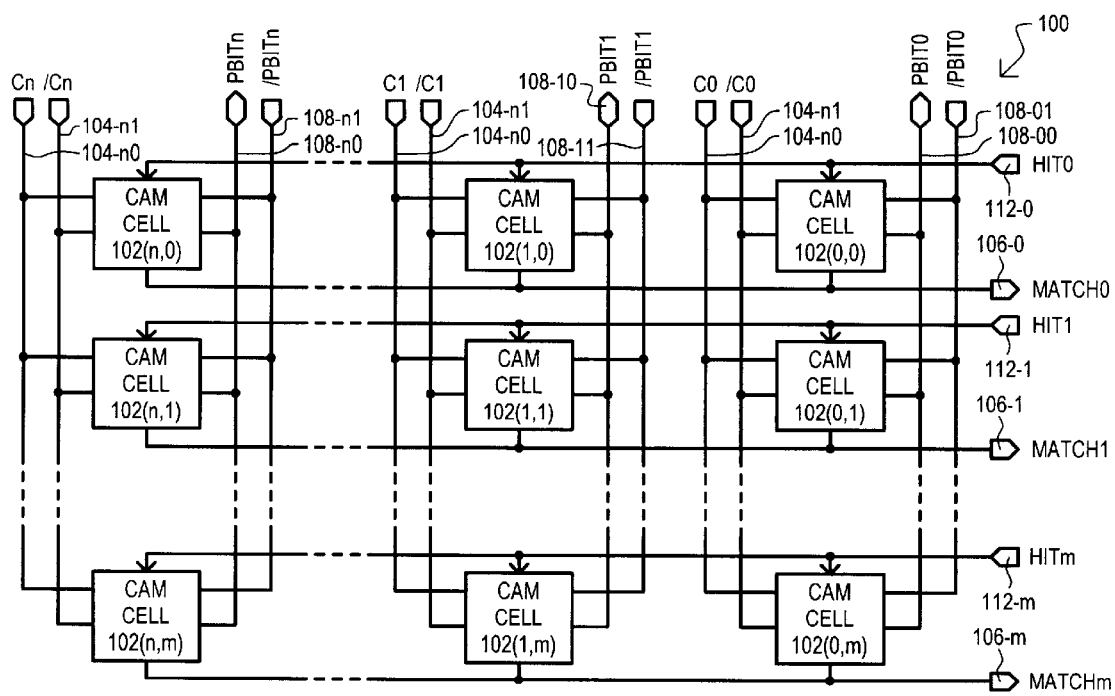
FIG. 1 is a block diagram of a novel content addressable memory (CAM) array according to a first embodiment.

Referring now to FIG. 1 an embodiment is set forth in a block diagram. The embodiment is a novel CAM array, and is designated by the general reference character 100. The novel CAM array 100 includes novel CAM cells, shown as 102($x,y$), where x indicates a particular array column and y indicates a particular array row.

In the particular view of FIG. 1, the CAM cells of same column are commonly connected to complementary comparand bit lines (104-n0/104-n1 to 104-00/104-01). For example, complementary comparand bit lines 104-n0/104-n1 are connected to CAM cells 102(n,0), 102(n,1) . . . 102(n,m). The CAM cells of the same row are commonly connected to a match line (106-0 to 106-m). For example, match line MATCH0 (106-0) is connected to CAM cells 102(n,1), 102(n−1,1) . . . 102(0,1). It is understood that the novel CAM cells 102($x,y$) can be connected to bit lines, including complementary bit line pairs, on a column-wise basis. Bit lines are not included in FIG. 1 to avoid unduly cluttering the view.

The novel CAM cells 102($x,y$) can each store, or receive, mask information. The mask information can allow the CAM cells 102($x,y$) to function in an essentially ternary fashion. The novel CAM cells 102($x,y$) can further include a mask compare capability. The mask compare capability can allow each CAM cell 102($x,y$) to compare a longest prefix bit value to a mask bit value stored within the CAM cell 102($x,y$).

Unlike conventional CAM approaches, the novel CAM cell array 100 of FIG. 1 also includes prefix bit line pairs (108-n0/108-n1 to 108-00/108-01) that are commonly connected to CAM cells 102($x,y$) of the same column. Prefix bit line pairs (108-n0/108-n1 to 108-00/108-01) can carry a longest prefix bit value. The generation of a longest prefix value will be described in more detail below.

The arrangement of FIG. 1 further differs from a conventional CAM approach in that it also includes hit lines (112-0 to 112-m). A hit line (112-0 to 112-m) is commonly connected to the CAM cells 102($x,y$) of the same row. A hit line (112-0 to 112-m) may follow the match line of its corresponding row. For example, if match line MATCH1 106-1 is activated, hit line HIT1 112-1 can also be activated.

Having described the general arrangement of a novel CAM cell array 100 according to one embodiment, the operation of CAM cell array 100 will be described in conjunction with a timing diagram set forth in FIG. 2.

Prior to a longest prefix matching function, the novel CAM cell array 100 can be loaded with data values on a row-by-row basis. Mask data can be provided for each data word, allowing all or a portion of a data word to be masked from a comparison operation. The masked portions of a data word will indicate a match condition whether or not the masked data bits match corresponding bits of an applied comparand value. As noted above, the mask data can be stored on a cell-by-cell basis.

It will be recalled that the data values do not have to be stored in a particular order within the CAM 100. This is in contrast to conventional ternary CAMs that often require data values to be stored in a particular row order according to prefix length.

Figure 2:
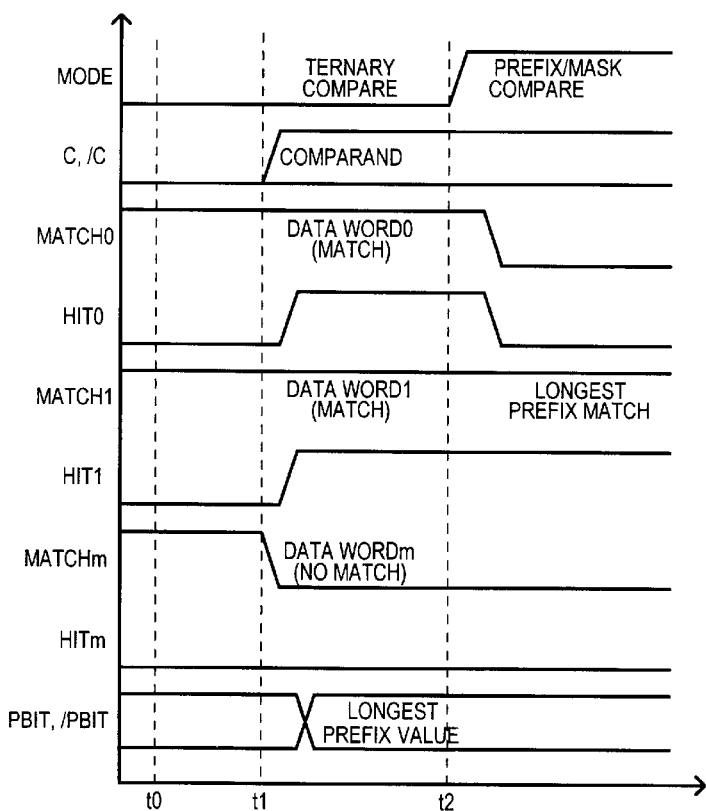
FIG. 2 is a timing diagram illustrating the operation of a CAM array according to the first embodiment.

Referring now to FIG. 2, a timing diagram is set forth illustrating various values and signals that can be involved in a longest prefix matching operation.

In the particular example of FIG. 2, a MODE waveform can correspond to a MODE signal. When the MODE signal is low, the mask bit compare capability of each CAM cell 102($x,y$) will be disabled, Thus, the various novel CAM cells 102($x,y$) can operate in a conventional ternary mode, providing a match indication between a stored data bit value and an applied comparand bit value. Match indications can be masked according to a stored mask data bit. When the MODE signal is high, the mask compare capability in each CAM cell 102($x,y$) will be enabled. Thus, each CAM cell 102($x,y$) can further provide a match indication between an applied longest prefix bit and a stored mask bit value.

FIG. 2 also includes a "C, /C" waveform that represents an applied comparand value.

Three match signals MATCH0, MATCH1 and MATCHm are set forth along with corresponding hit signals HIT0, HIT1 and HITm. Match signals in the example of FIG. 2 are active when high, and inactive when low. Similarly, hit signals are active when high and inactive when low. It is understood that in the particular arrangement of FIG. 1, the MATCH0 signal can indicate a match between an applied comparand value and a DATA0 value stored in the first row of the novel CAM array 100. Similarly, the MATCH1 and MATCHm signals can indicate matches between the applied comparand value and a DATA1 and DATAm value, stored in the second and last (mth) rows, respectively, of the novel CAM cell array 100.

A PBIT waveform represents prefix bit values that can be provided on a per column basis in the novel CAM cell array 100 of FIG. 1. The PBIT value can represent the length of a longest prefix value of a given match operation.

Referring back to FIG. 2, once data values are stored within the CAM array 100, match lines (106-0 to 106-m) can be precharged to a predetermined logic level (high, for example) and the comparand value lines (104-n0/104-n1 to 104-00/104-01) can be precharged to a predetermined logic level (low, for example). Further, hit lines (112-0 to 112-m) can be precharged to a predetermined logic level (low, for example).

At time t1, a comparand value can be applied to the CAM array 100 by driving complementary comparand values lines (104-n0/104-n1 to 104-00/104-01) accordingly. This is shown in FIG. 2 by the "COMPARAND" portion of the "C, /C" waveform that begins at time t1.

Following the application of the comparand value, the MATCH0 and MATCH1 signals remain high, indicating a ternary match indication for the DATA0 and DATA1 values. It is understood that while two match conditions exist, the prefix of one data value may be longer than the other. In the particular example of FIG. 2, the DATA1 value is assumed to have a longer prefix than the DATA0 value. Unlike the previously described match signals (MATCH0 and MATCH1), the MATCHm signal is driven low, indicating no ternary match between the DATAm value and the applied comparand value.

Because the MATCH0 and MATCH1 lines are activated in the example of FIG. 2, the HIT0 and HIT1 lines are activated in response to the ternary match operation. Because the MATCHm was a "no match" indication, the HITm signal remains inactive (low).

The activation of hit signals (such as HIT0 and HIT1), in combination with mask data values for the data words, can result in the prefix values for the data words being placed on the prefix bit lines (108-00/108-01 to 108-n0/108-n1). Prefix values can be the inverse of the mask data values. In one particular arrangement, one or more prefix values can be logically "ORed" (or "NORed") on a column-by-column basis. Consequently, the prefix bit lines (108-00/108-01 to 108-n0/108-n1) can carry the prefix values for the data value having the longest prefix match. This is represented in FIG. 2 by the portion of the PBIT waveform shown as "LONGEST PREFIX VALUE" beginning shortly after time t1. In this way, a longest prefix value can be placed on the prefix bit lines (108-00/108-01 to 108-n0/108-n1).

It is noted that a prefix bit value for a given column can be placed on only one prefix bit line of the corresponding bit line pair. Alternatively, as will be described below, one prefix line can be used to detect a longest prefix bit while a different prefix bit line pair can be used to apply the prefix bit value to a column of CAM cells.

Once a longest prefix value is determined, the longest prefix value can be compared with the mask bits of those data values that provide a ternary match indication. In the particular arrangement illustrated by FIGS. 1 and 2, this can be accomplished by the MODE signal transitioning high at time t2. At this time, the longest prefix value can be globally applied to the novel CAM array 100 by way of prefix bit line pairs (108-00/108-01 to 108-n0/108-n1). It is noted that prior to the application of the longest prefix value to the CAM array 100, the prefix bit line pairs (108-00/108-01 to 108-n0/108-n1) could be globally masked by driving complementary prefix bit line pairs to the same logic level (low, for example).

By applying a longest prefix value to the ternary match cases, a longest prefix match can be determined. As shown in FIG. 2, after time t2, the MATCH0 value returns low, as the corresponding DATA0 value has a shorter prefix than the DATA1 value. The MATCH1 value remains high, indicating the corresponding DATA1 value can have the longest prefix.

In this way, an embodiment illustrated by FIGS. 1 and 2 can use a ternary compare operation to determine a longest prefix value from multiple data value matches. The mask data of the multiple data value matches can then be globally compared to the longest prefix value to determine which of the multiple data value matches is the longest prefix match.

The particular arrangement described by FIGS. 1 and 2 can be conceptualized as including a first cycle, which involves a ternary compare operation and longest prefix value determination, and a second cycle, which involves a global prefix/mask value compare operation. It is understood that the compare value lines (104-n0/104-n1 to 104-00/104-01) may only be driven once with comparand values in the first cycle. Similarly, in the second cycle, the prefix bit lines may only be driven once with longest prefix. Limiting the amount of times lines are charged can limit the power consumption of a device.

It is also understood that while most applications may include a consecutive prefix for data values, the longest prefix value is not necessarily a set of contiguous comparand bit values. Logic could be provided to determine priority from different non-contiguous longest prefix values. In such a case longer prefix values would be supersets of any shorter prefix values.

Figure 3:
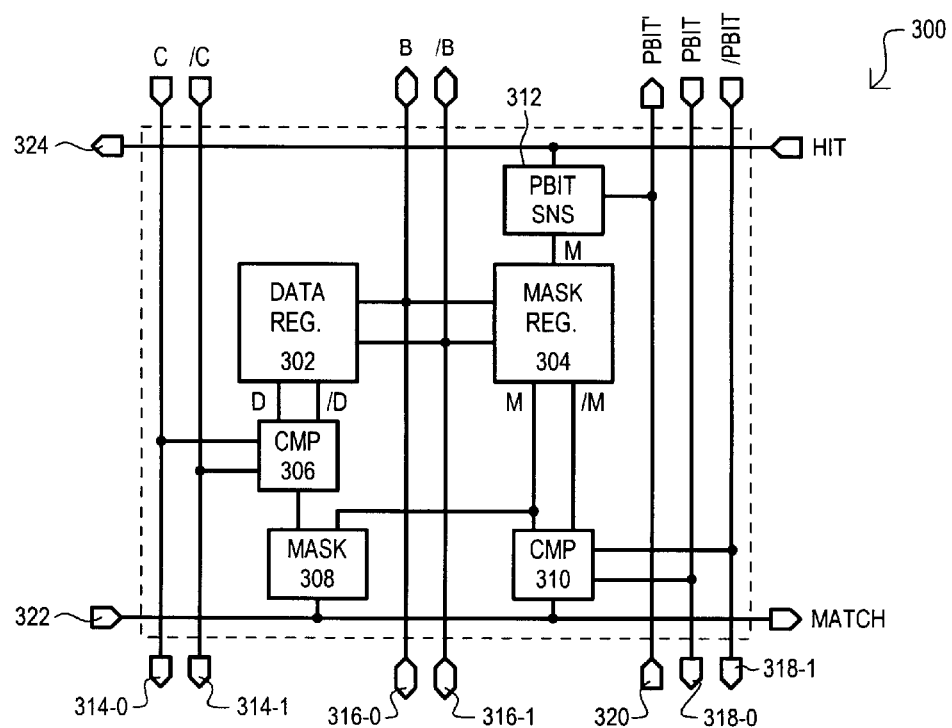
FIG. 3 is a block diagram of a novel CAM cell according to one embodiment.

Referring now to FIG. 3, a first novel CAM cell is set forth in a block schematic diagram. The novel CAM cell is designated by the general reference character 300, and may be used as a CAM cell (such as 104(*x,y*) in FIG. 1). The novel CAM cell 300 is shown to include a data register 302 that can store a data value and a mask register 304 that can store a prefix/mask bit for the data value. FIG. 3 further includes a data compare circuit 306, a mask circuit 308, a prefix/mask compare circuit 310, and a prefix bit sense circuit 312.

A number of lines can supply values to various parts of the novel CAM cell 300. Complementary comparand value lines 314-0 and 314-1 can supply a comparand bit value to the data compare circuit 306. Complementary bit lines 316-0 and 316-1 can supply a data bit value to data register 302 and/or a prefix/mask bit to mask register 304. Complementary prefix bit drive lines 318-0 and 318-1 can supply a longest prefix bit value to the prefix/mask compare circuit 310. Also set forth in FIG. 3 is a prefix bit detect line 320 that can detect a longest prefix bit value for a column of novel CAM cells 300.

In some arrangements, the data register 302 can be accessed by a data word line (not shown). Similarly, the mask register 304 can be accessed by a mask word line (not shown).

The data compare circuit 306 can compare complementary data values (D and /D) to complementary comparand values (C and /C). The results of the comparison can be coupled to the mask circuit 308. The mask circuit 308 is controlled by a mask value M (or its inverse /M) supplied from mask register 304. When the mask value is inactive (low) a match result can be coupled to a match line 322.

An alternate way of conceptualizing the arrangement of FIG. 3 is to note that the compare circuit 306 and mask circuit 308 can provide a discharge (or charge) path between a discharge (or charge) potential and the match line 322. When the mask bit M is active, the discharge (charge) path provided by the mask circuit 308 may be disabled, regardless of the match result of the compare circuit 306. When the mask bit is inactive, the discharge (charge) path provided by the mask circuit 308 may be enabled, and the match line 322 can be discharged (or charged) according to the match result of the compare circuit 306.

Unlike a conventional ternary CAM cell arrangement, the novel CAM cell 300 further includes the prefix/mask compare circuit 310. The prefix/mask compare circuit 310 can compare complementary mask bit values (M and /M) to complementary longest prefix bit values (PBIT and /PBIT). The results of the comparison can be coupled to the match line 322.

Thus, in the particular arrangement of FIG. 3, the match line may be discharged due to a comparand bit/data bit compare operation or a mask bit/longest prefix bit compare operation.

The novel CAM cell 300 further differs from a conventional CAM in that it includes a prefix bit sense circuit 312 connected to the prefix bit detect line 320. The prefix bit sense circuit 312 is enabled by a hit signal HIT carried on a hit line 324. When the hit signal HIT is active, the prefix bit sense circuit 312 can drive the prefix bit detect line 320 according to the mask bit value M (or /M, which can be considered an inverse prefix (mask) value).

It is understood that the prefix bit detect line 320 can be shared by a column of novel CAM cells. In the event a ternary match operation results in multiple data word match indications, and a mask bit in one of the matched data words is inactive (i.e., its prefix value is active), the prefix bit line for the entire column can be activated. In this way, a prefix bit value can be provided for an entire column of a novel CAM cell array.

It is noted that while the particular arrangement of FIG. 3 provides a prefix bit detect line 320 that is separate from the complementary prefix bit lines (318-0/318-1) and/or the complementary data bit lines (316-0/316-1), alternate novel CAM cell approaches can have dual function line.

Figure 4:
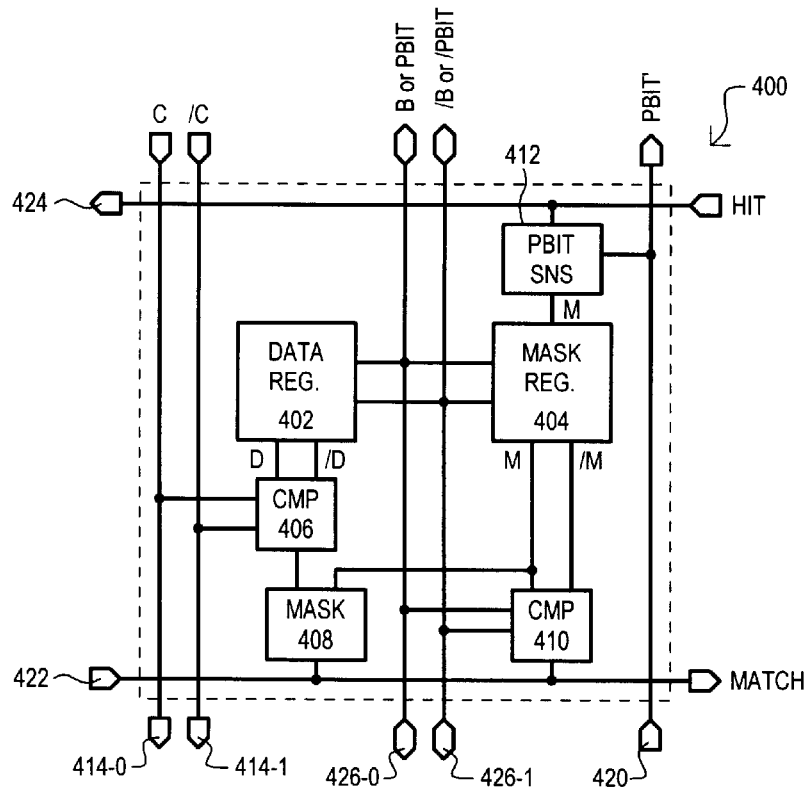
FIG. 4 is a block diagram of a novel CAM cell according to another embodiment.

Referring now to FIG. 4, one example of a novel CAM cell is set forth in a block schematic diagram. The novel CAM cell is designated by the general reference character 400, and can include some of the same circuit portions as the embodiment of FIG. 3. To that extent, like portions will be referred to by the same reference character, but with the first digit being a "4" instead of "3."

The second novel CAM cell 400 can differ from first novel CAM cell 300 in that data bit lines are not separate from prefix bit lines. Thus, the second novel CAM cell 400 includes complementary data/prefix bit lines 426-0 and 426-1. The data/prefix bit lines (426-0/426-1) are coupled to the data register 402, the mask register 404, and the mask compare circuit 410. Thus, a data bit and mask bit can be stored in, or read from the data register 402 and mask register 404 by way of data/prefix bit lines (426-0/426-1). Further, in a longest prefix match operation, a longest prefix bit value can be applied to the mask compare circuit 410 by way of data/prefix bit lines (426-0/426-1).

Figure 5:
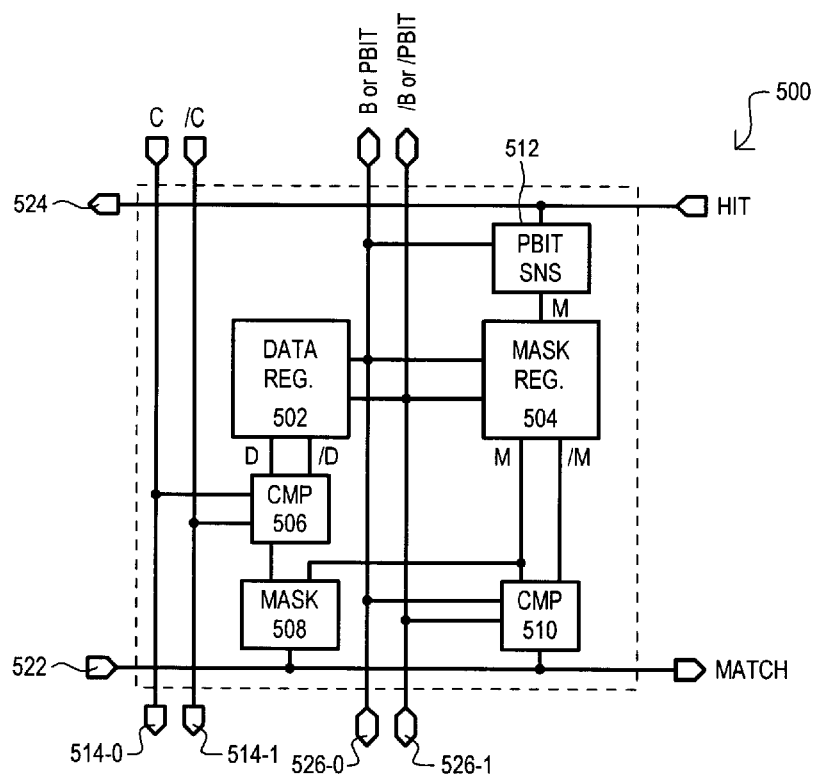
FIG. 5 is a block diagram of a novel CAM cell according to another embodiment.

Referring now to FIG. 5, a third example of a novel CAM cell is set forth in a block schematic diagram. The third novel CAM cell is designated by the general reference character 500, and can include some of the same circuit portions as the embodiments of FIGS. 3 and 4. To that extent, like portions will be referred to by the same reference character, but with the first digit being a "5" instead of "3" or a "4."

The third novel CAM cell 500 can differ from first and second novel CAM cells (300 and 400) in that a prefix bit detect line is not separate from a complementary prefix bit line pair. Thus, in the third novel CAM cell 500, one data/prefix bit line 526-0 can be a prefix bit detect line. Therefore, in the arrangement of FIG. 5, a prefix bit sense circuit 312 can be coupled to data/prefix bit line 526-0.

It is further noted that a CAM cell array can include only one prefix bit line. A longest prefix bit value can be generated on the one prefix bit line, and an inverter can be included within each novel CAM cell to generate a complementary longest prefix bit value for use in a mask compare circuit, or the like.

Figure 6:
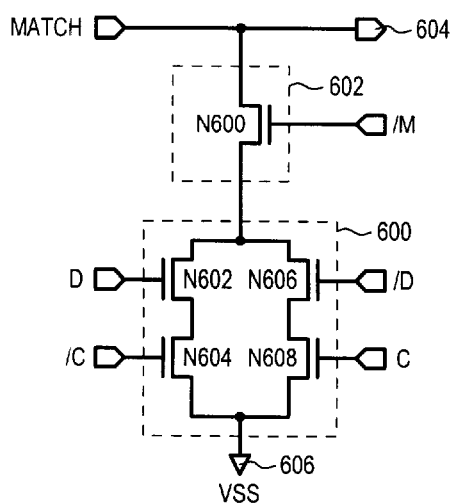
FIG. 6 is a schematic diagram of a first example of compare and mask circuits that may be used in an embodiment.

Referring now to FIG. 6, a schematic diagram is set forth illustrating a first example of a data compare circuit and mask circuit that may be used in the embodiments. The data compare circuit is designated by the reference character 600 and the mask circuit is shown as 602. A mask circuit 602 and data compare circuit 600 can provide a low impedance path between a match line 604 and a predetermined voltage node 606. In the particular arrangement of FIG. 6, a discharge path can be formed between the match line 604 and a low power supply voltage VSS according to a prefix/mask bit value /M, a data value (D and /D), and a comparand value (C and /C).

The mask circuit 602 can include an insulated gate field effect transistor (IGFETs) having a source-drain path arranged in parallel between the match line 604 and the data compare circuit 600. In the arrangement of FIG. 6, the mask circuit 602 includes an n-channel MOSFETs N600 having a drain connected to the match line 604 and a source connected to the compare circuit 600. The gate of transistor N600 receives an inverse mask (prefix) bit value /M. In this arrangement, the mask circuit 602 will provide a low impedance value when the inverse mask bit /M is high, and a high impedance path when the inverse mask value /M is low.

The compare circuit 600 can include controllable impedance paths, at least one of which is enabled when a data bit value and a comparand bit value are different. The paths can be formed by the series arrangement of IGFETs. In the particular arrangement of FIG. 6, a first path is formed by two n-channel MOSFETs N602 and N604, having source-drain paths arranged in series between the mask circuit 602 and the voltage node 606. The gate of transistor N602 receives a data value D. The gate of transistor N604 receives an inverse comparand value /C. A second path is formed by two other n-channel MOSFETs, N604 and N608, also having source-drain paths arranged in series between the mask circuit 602 and the voltage node 606. The gate of transistor N606 receives an inverse data bit value /D and the gate of transistor N608 receives a comparand bit value C.

Figure 7:
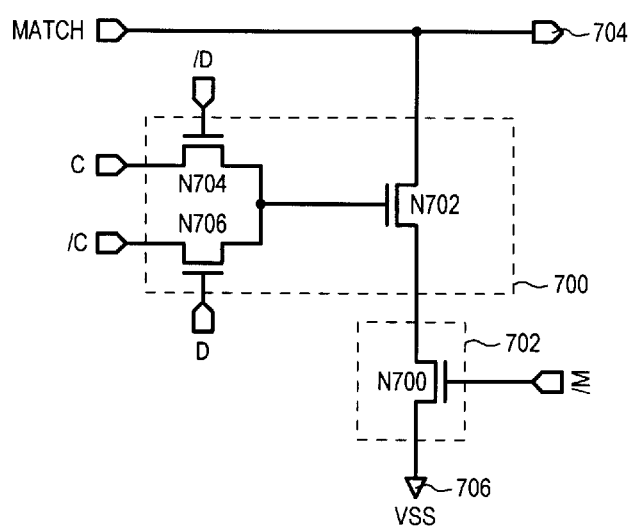
FIG. 7 is a schematic diagram of a second example of compare and mask circuits that may be used in an embodiment.

Referring now to FIG. 7, a schematic diagram is set forth illustrating a second example of a compare circuit 700 and data mask circuit 702. A data mask circuit 702 and compare circuit 700 can provide a low impedance path between a match line 704 and a predetermined voltage node 706. In the particular arrangement of FIG. 7, like that of FIG. 6, a discharge path can be formed between the match line 704 and a low power supply voltage VSS.

The mask circuit 702 can have the same general arrangement as that of FIG. 6, and is shown to include a transistor N700.

The compare circuit 700 of FIG. 7 can include one impedance path that is enabled when a data bit value and a comparand bit value are different. The path can be formed by an IGFET. In the particular arrangement of FIG. 7, the path is formed by an n-channel MOSFET N702 having a source-drain path arranged in series between the mask circuit 702 and a match line 704. The gate of transistor N702 can be controlled by two other n-channel MOSFETs N704 and N706.

Transistors N704 and N706 can have drains that are commonly connected to the gate of transistor N702. The source of transistor N704 can be connected to a comparand value C and the source of transistor N706 can be connected to an inverse comparand value /C. The gate of transistor N704 can receive an inverse data bit value /D. The gate of transistor N706 can receive a data bit value D. In this arrangement, when a comparand value differs from a data bit value, transistor N702 will be turned on, creating a low impedance path between the match line 704 and the mask circuit 702.

It is understood that the particular order of a mask circuit and compare circuit between a match line and a discharge (or charge) voltage should not be construed as limiting the invention thereto. Further, the particular type of active devices (e.g., n-channel MOSFETs) should also not be construed as limiting either.

Figure 8:
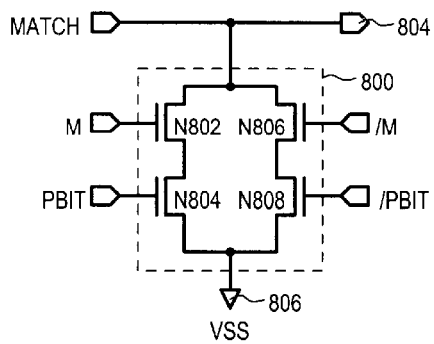
FIG. 8 is a schematic diagram of a first example of a mask compare circuit.

Referring now to FIG. 8, a schematic diagram is set forth illustrating a first example of a prefix/mask compare circuit that may be used in an embodiment. The prefix/mask compare circuit is designated by the general reference character 800, and can have the same general arrangement as the data compare circuit 600 of FIG. 6, including four n-channel MOSFETS, N802, N804, N806, and N808. Instead of comparing a comparand bit and a data bit, the mask compare circuit 800 compares a mask bit (M and /M) to a longest prefix value bit (PBIT and /PBIT).

The data compare circuit 600 can be situated between a match line 804 and a discharge voltage node 806. In this arrangement, when the match bit (M and /M) differs from a longest prefix value bit (PBIT and /PBIT), the match line 804 can be discharged.

Figure 9:
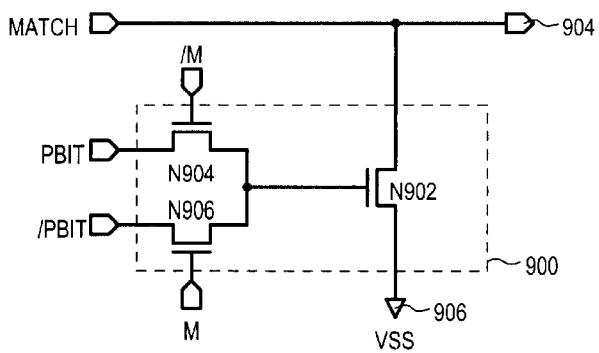
FIG. 9 is a schematic diagram of a second example of a mask compare circuit.

FIG. 9 sets forth a schematic diagram of a second example of a mask compare circuit. The mask compare circuit is designated by the general reference character 900, and can include the same general arrangement as the compare circuit 700 of FIG. 7. The mask compare circuit 900 can thus discharge a match line 904 when a match bit (M and /M) differs from a longest prefix value bit (PBIT and /PBIT).

Figure 10:
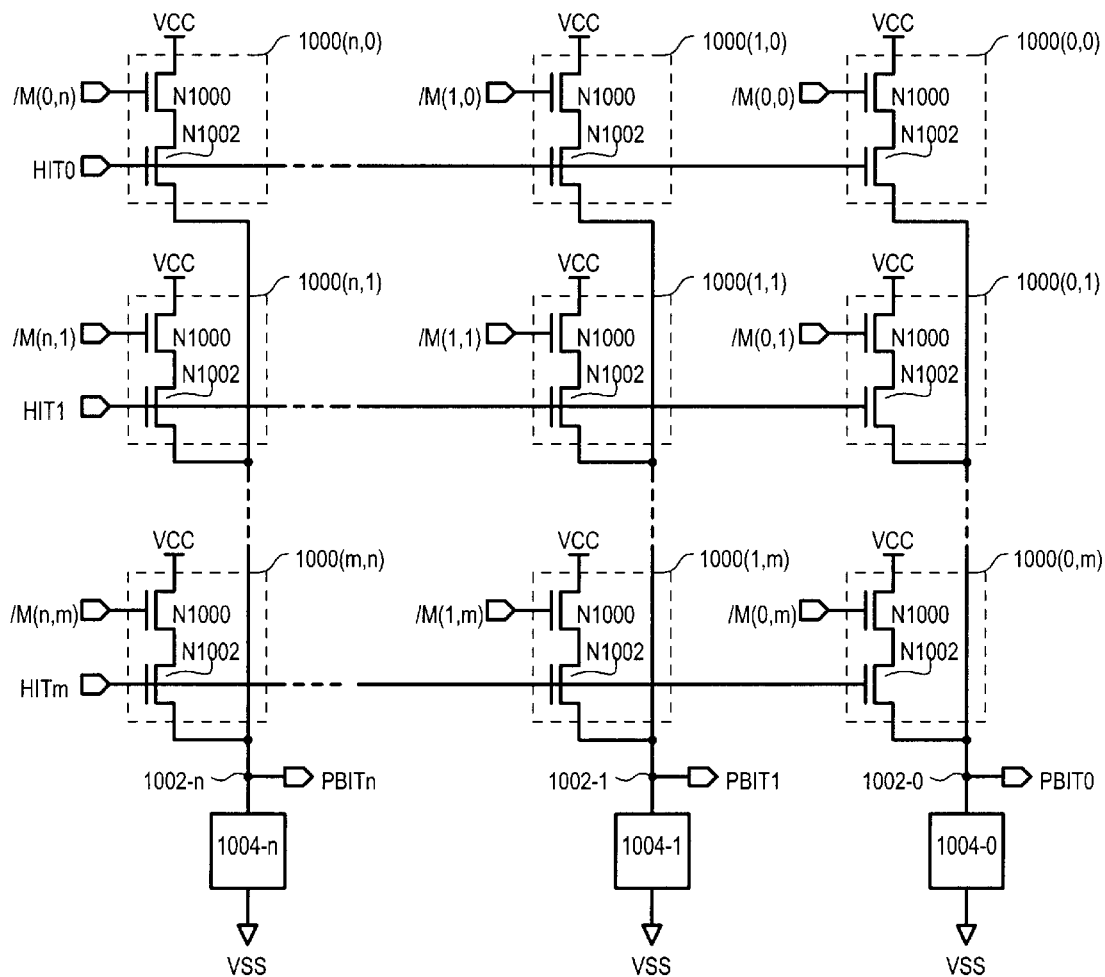
FIG. 10 is a schematic diagram illustrating prefix bit sense circuits and prefix line circuits that may be used in an embodiment.

Referring now to FIG. 10, a schematic diagram is set forth illustrating prefix bit sense circuits and prefix line circuits that may be used in an embodiment. FIG. 10 includes prefix bit sense circuits for a novel CAM cell array that includes n x m novel CAM cells, where n is the number of columns and m is the number of rows in the CAM cell array. The prefix bit sense circuits are shown as 1000($x,y$), where x represents a particular row of the array and y represents a particular column.

Each prefix bit sense circuit 1000($x,y$) includes an impedance path that is controllable according to a hit signal (HIT0 to HITm) common to a CAM cell array row, and an inverse mask (prefix) bit value /M($x,y$) associated with a particular CAM cell. The controllable impedance path is situated between a prefix bit line (1002-n to 1002-0) and a predetermined voltage. The prefix bit lines (1002-n to 1002-0) can be commonly connected to the prefix bit sense circuits 1000($x,y$) of the same column. Each of the prefix bit lines (1002-n to 1002-0) can provide a local prefix bit signal (PBITn to PBIT0) for a given CAM cell array column.

In the particular arrangement of FIG. 10, the controllable impedance path is formed from two n-channel MOSFETs (N1000 and N1002) having source-drain paths arranged in series with a high power supply VCC. The gate of a transistor N1000 can receive an inverse mask value /M($x,y$). The gate of a transistor N1002 can receives one of the hit signals (HIT0 to HITm).

FIG. 10 further includes a precharge circuit (1004-n to 1004-0) associated with each prefix bit line (1002-n to 1002-0). The precharge circuits (1004-n to 1004-0) can precharge the prefix bit lines (1002-n to 1002-0) to a predetermined voltage (low, for example). The prefix bit sense circuits 1000($x,y$) may then drive selected prefix bit lines (1002-n to 1002-0) toward a different voltage (high, for example). In this way, in the particular arrangement of FIG. 10, each prefix bit line (1002-n to 1002-0) and its associated prefix bit sense circuits 1000($x,y$) can function in a logical NOR fashion, more specifically a "wire-NOR" fashion.

The precharge circuits (1004-n to 1004-0) can take a variety of forms. As just two of the many possible examples, a precharge circuit (1004-n to 1004-0) can be a static circuit that includes a "leaker" transistor, or the like, or a dynamic circuit that includes a precharge transistor activated by a clock signal, or the like.

While various embodiments have described a single novel CAM cell array, a semiconductor device can include multiple such arrays, and provide longest prefix matching functions across all of the arrays. One way to accomplish such a result is to include prefix value summing circuits that receive local prefix bit values of one array, and logically sum them with corresponding local prefix bit values of other arrays. One example of such a prefix value summing circuits is set forth in FIG. 11.

Figure 11:
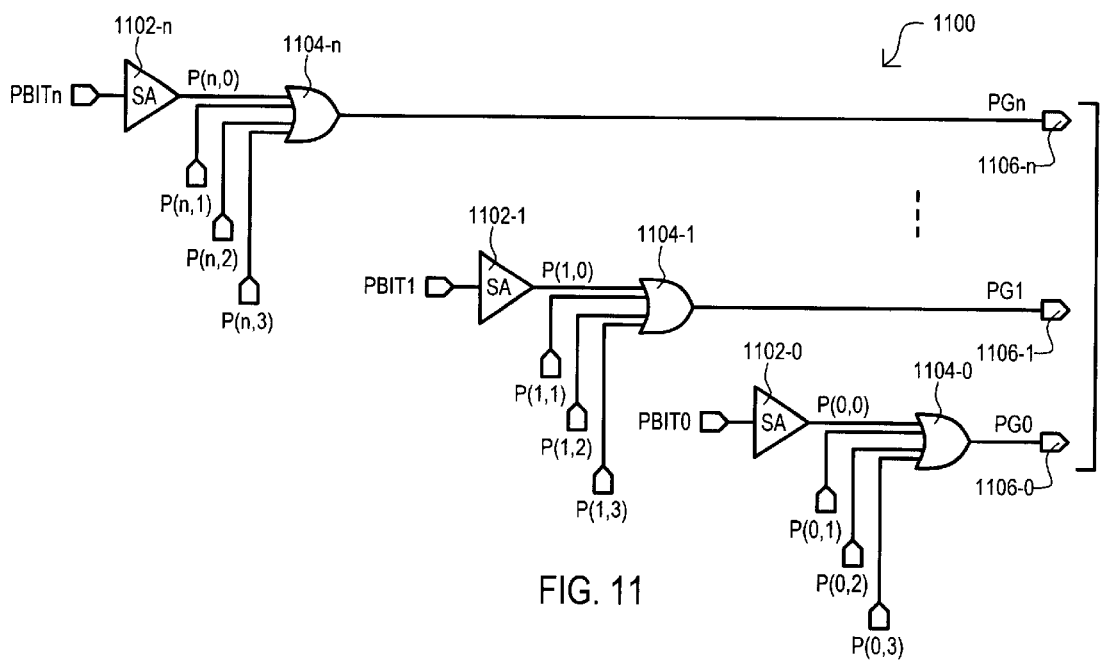
FIG. 11 is a schematic diagram illustrating prefix value summing circuits according to one embodiment.

The prefix value summing circuit of FIG. 11 is designated by the general reference character 1100. The prefix value summing circuit 1100 includes sense amplifiers 1102-n to 1102-0 and summing gates 1104-n to 1104-0. Sense amplifiers (1102-n to 1102-0) can receive local longest prefix bit values (such as PBITn to PBIT0) and amplify the signals to generate amplified local longest prefix bit values P(y,z), where y represents a CAM array column and z represents a particular CAM array.

Summing gates 1104-n to 1104-0 can receive amplified local longest prefix bit values P(y,z), and logically combine them to generate global longest prefix bit values PGy on global prefix bit lines 1106-n to 1106-0. It is understood that the summing of local prefix bit values can be accomplished by various other types of structures. As just one example, rather than employ one logic gate having multiple inputs, a series of smaller logic gates could be utilized.

Figure 12:
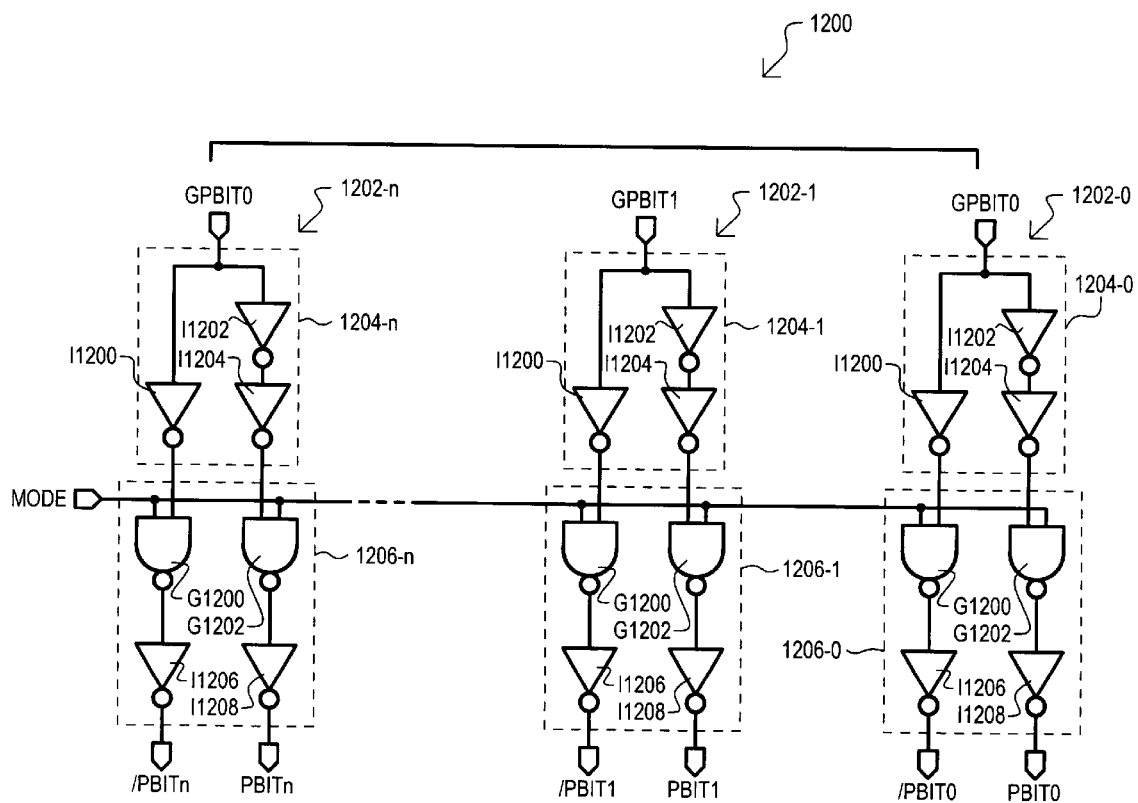
FIG. 12 is a schematic diagram of a global mask arrangement according to one embodiment.

Referring now to FIG. 12, a global mask circuit for a novel CAM cell array is set forth in a schematic diagram. The global mask circuit is designated by the general reference character 1200 and is shown to include column mask circuits (1202-n to 1202-0) associated with each column of the novel CAM cell array. Each column mask circuit (1202-n to 1202-0) can include a buffer section (1204-n to 1204-0) and a global mask section (1206-n to 1206-0).

The buffer sections (1204-n to 1204-0) can receive a global longest prefix bit value (GPBITn to GPBIT0) and provide complementary buffered global longest prefix bit values. In the particular arrangement of FIG. 12, the buffer sections (1204-n to 1204-0) include an inverter I1200 that provides an inverted global longest prefix bit value (/GPBITn to /GPBIT0) and two inverters in series (I1202 and I1204) that provide non-inverted global longest prefix bit value (GPBITn to GPBIT0).

The global mask sections (1206-n to 1206-0) can receive a global longest prefix bit value and mask the value according to a mode signal value MODE. In the particular arrangement of FIG. 12, the global mask sections (1206-n to 1206-0) include AND gates (formed from NAND gates G1200 and G1202, and corresponding inverters I1206 and I1208). Each AND gate receives a global longest prefix bit value (GPBITn to GPBIT0 or /GPBITn to /GPBIT0) as one input and a mode signal value as another input. In this arrangement, when the mode signal value MODE is active (high), the AND gates can provide complementary longest prefix bit values (PBITn and /PBITn). When the mode signal MODE is inactive (low), the AND gates drive their complementary longest prefix bit values (PBITn and /PBITn) to the same logic level (low).

Figure 13:
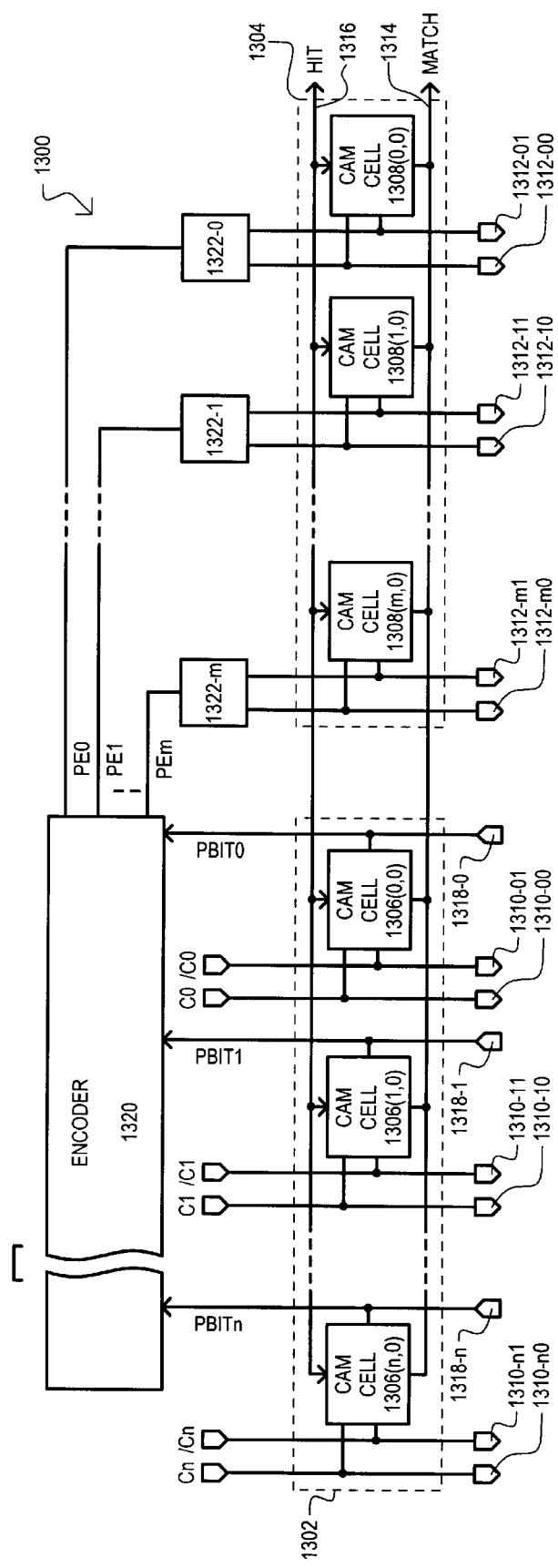
FIG. 13 is a block diagram of a novel content addressable memory (CAM) array according to a second embodiment.
Figure 16:
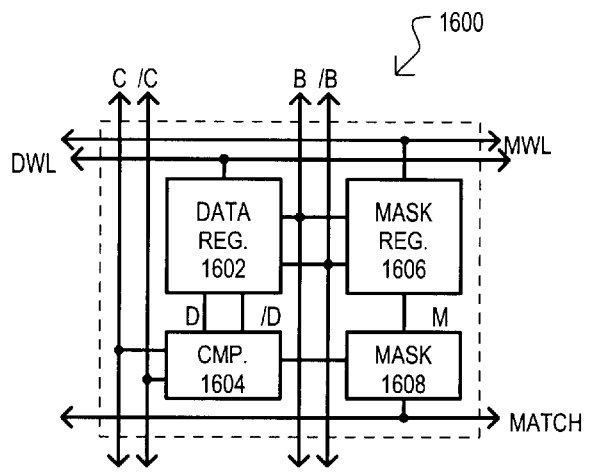
FIG. 16 is a block diagram of a conventional ternary CAM cell.
Figure 17:
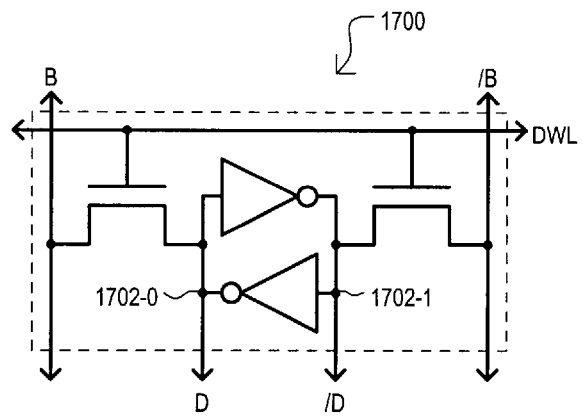
FIG. 17 is a schematic diagram of a conventional register circuit.
Figure 18:
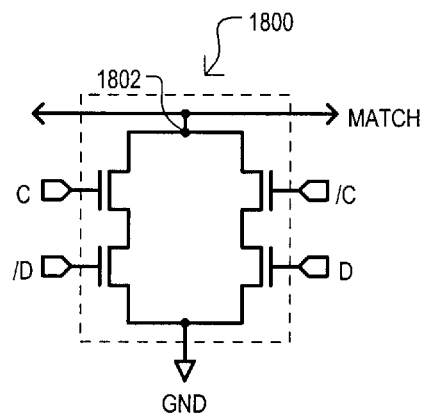
FIG. 18 is a schematic diagram of a conventional compare circuit.

Referring now to FIG. 13 a second embodiment is set forth in a block diagram. The embodiment is a novel CAM array, and is designated by the general reference character 1300. The novel CAM array 1300 can be conceptualized as including a CAM data array 1302 and a CAM encoded prefix value array 1304. The CAM data array 1302 can include data CAM cells, shown as 1306(x,y), where x indicates a particular data array column and y indicates a particular data array row. The CAM encoded prefix value array 1304 can include prefix CAM cells, shown as 1308(v,w), where v indicates a particular column in the encoded prefix value array 1304 and w indicates a particular row in the encoded prefix value array 1304. In the arrangement of FIG. 13, the number of rows in the CAM encoded prefix value array 1304 w can be equal to the number of rows in the CAM data array 1302. Further, each row of the CAM data array 1302 can be aligned with a row of the CAM encoded prefix value array 1304.

In the particular view of FIG. 13, a row of data CAM cells and prefix CAM cells (1306(x,y) and 1308(v,w)) is illustrated. It is understood that y such rows could be included in an array. In the CAM data array 1302, data CAM cells 1306(x,y) of same column can be commonly connected to complementary comparand bit lines 1310-n0/1310-n to 1304-00/1304-01. For example, complementary comparand bit lines 1310-n0/1310-n1 are shown coupled to data CAM cell 1306(n,0). In a similar fashion, prefix CAM cells 1308(v,w) of same column can be commonly connected to complementary prefix bit lines 1312-m0/1312-m1 to 1312-00/1312-01. For example, complementary prefix bit lines 1312-10/1312-11 are shown coupled to prefix CAM cell 1308(1,0).

Referring once again to FIG. 13, the data CAM cells 1306(x,y) of the same row can be commonly connected to a match line 1314. A corresponding row of prefix CAM cells 1308(v,w) can also be coupled to the same match line 1314. In addition, data CAM cells 1306(x,y) of the same row can also be commonly connected to a hit line 1316. It is understood that the data CAM cells 1306(x,y) and prefix CAM cells 1308(v,w) can be connected to data bit lines, including complementary data bit line pairs on a column-wise basis. Such data bit lines are not included in FIG. 13 to avoid unduly cluttering the view.

As in the first embodiment 100, the data CAM cells 1306(x,y) of the same column can be commonly coupled to a prefix detect line (1318-n to 1318-0).

Unlike the first embodiment 100, the prefix detect lines (1318-n to 1318-0) are connected to an encoder 1320. Encoder 1320 can receive a longest prefix value from the prefix detect lines (1318-n to 1318-0) and encode the value into an encoded largest prefix value. For example, a longest prefix value PBITn, . . . PBIT1, PBIT0 can be encoded into a value PEm, . . . PE1, PE0. As just one example, a longest prefix value of "n" bits can be encoded into an encoded prefix value of "m" bits, where m =log$_2$n. It is understood that alternative approaches could have an encoder 1320 that can encode consecutive mask bit values to provide an encoded mask bit value (as a mask value can be the inverse of a prefix value).

Each bit of an encoded prefix value (PEm to PE0) can be supplied to a corresponding global mask circuit 1322-m to 1322-0. Each global mask circuit (1322-m to 1322-0) is coupled to a pair of complementary prefix bit lines (1312-m0/1312-m1 to 1312-00/1312-01). Further, each global mask circuit (1322-m to 1322-0) can receive a mode signal MODE. When the MODE signal has a first value, the global mask circuits (1322-m to 1322-0) can drive their respective complementary prefix bit line pairs (1312-m0/1312-m1) to 1312-00/1312-01) to the same logic value. When the MODE signal has a second value, the global mask circuits (1322-m to 1322-0) can drive their respective complementary prefix bit line pairs (1312-m0/1312-m1 to 1312-00/1312-01) according to their corresponding encoded prefix bit value (PEm to PE0).

As in the case of the first embodiment 100, prior to a longest prefix matching function, the CAM data array 100 can be loaded with data values on a row-by-row basis. Prefix/mask data can be provided for each data word, allowing all or a portion of a data word to be masked from a comparison operation. In the particular arrangement of FIG. 13, prefix/mask data is assumed to establish a conventional contiguous prefix length. For example, two data values are set forth below, where an "X" indicates a masked data bit. Both values include contiguous prefixes (that are the inverse of the mask bits).

| | | | | |
|---|---|---|---|---|
| 11110000 | 10XXXXXX | XXXXXXXX | XXXXXXXX | (data 0) |
| 00000000 | 00111111 | 11111111 | 11111111 | (mask 10) |
| 11110000 | 10010101 | 100XXXXX | XXXXXXXX | (data 1) |
| 00000000 | 00000000 | 00011111 | 11111111 | (mask 19) |

Unlike the first embodiment 100, in the second embodiment 1300 each row of the CAM encoded prefix value array 1304 can store the encoded prefix values of the corresponding data value. An encoded prefix value can represent the length of the prefix of its corresponding data value. For example, the data 0 value set forth above would include an encoded prefix value of "01010" (binary 10). Further, the data 1 value would have a corresponding encoded prefix value of "10011" (binary 19).

As in the case of the first embodiment 100, in the second embodiment 1300, the data values do not have to be stored in a particular order within the CAM data array 1302.

The second embodiment 1300 can be described in conjunction with FIG. 2.

If reference is made to FIG. 2, the MODE waveform can represent the MODE signal, the "C, /C" waveform can represents an applied comparand value, the MATCH0, MATCH1 and MATCHm waveforms can represent three match lines, the HIT0, HIT1 and HITm waveforms can represent hit lines corresponding to the match lines, and the PBIT waveform can represent an encoded longest prefix value.

At time t1, a comparand value can be applied to the CAM data array 1302 by driving complementary comparand values lines (1310-n0/1310-n1 to 1310-00/1310-01). The comparand value results in a ternary match indication for MATCH0 and MATCH1. In the same general fashion as the first embodiment 100, a longest prefix value can be placed on the prefix detect lines (1318-n to 1318-0) by the multiple ternary match indications.

Also at time t1, the MODE signal can be low, causing the global mask circuits (1322-m to 1322-0) to drive their corresponding complementary prefix bit lines (1312-n0/1312-n1 to 1312-00/1312-01) to the same logic value.

A longest prefix value can then be encoded in the encoder 1320. The encoded longest prefix value can be applied to the global mask circuits (1322-m to 1322-0).

At time t2, the MODE signal can transition high, causing the global mask circuits (1322-m to 1322-0) to drive their corresponding complementary prefix bit lines (1312-n0/1312-n1 to 1312-00/1312-01) according to encoded prefix bit values (PEm to PE0).

The encoded prefix value can thus be applied by way of complementary prefix bit lines (1312-n0/1312-n1 to 1312-00/1312-01) to the CAM encoded prefix value array 1304. By applying a longest prefix value to the CAM encoded prefix value array 1304 a longest prefix value can be determined. As shown in FIG. 2, after time t2, the MATCH0 value is discharged by the prefix CAM cells coupled to its match line. The MATCH1 value remains high, indicating the corresponding DATA1 value can have the longest prefix.

In this way, an embodiment illustrated by FIGS. 13 and 2 can use a ternary compare operation to determine a longest prefix value from multiple data value matches. The longest prefix value can then be encoded and compared to encoded prefix values corresponding to each data value match.

The particular arrangement described by FIGS. 13 and 2 can be conceptualized as including a first cycle, which involves a ternary compare operation and longest prefix value determination, and a second cycle, which involves an encoded prefix compare operation.

Referring now to FIG. 14, a block schematic diagram is set forth illustrating a data CAM cell 1400, that could be used as item 1306(x,y) in FIG. 13, and a prefix CAM cell 1402, that could be used as item 1308(v,w).

The data CAM cell 1400 of FIG. 14 can include some of the same general constituents as the CAM cell set forth in FIG. 3. The particular arrangement of FIG. 14 includes a data register 1404, a mask register 1406, data compare circuit 1408, a mask circuit 1410, and a prefix detect circuit 1412.

A number of lines are connected to the data CAM cell 1400. Complementary comparand value lines 1414-0 and 1414-1 are arranged in a column direction and are coupled to the data compare circuit 1408. Complementary data bit lines 1416-0 and 1416-1 are arranged in a column direction and are coupled to the data register 1404 and mask register 1406. A prefix bit detect line 1418 is coupled to the prefix bit sense circuit 1412. In a row direction, a match line 1420 is coupled to the mask circuit 1410. Also in a row direction, a hit line 1422 is coupled to the prefix bit sense circuit 1412.

It is understood that the data CAM cell 1400 could be subject to some variation, including those illustrated by FIGS. 4 and 5.

The prefix CAM cell 1402 can include a prefix data register 1424 and a prefix compare circuit 1426. The prefix/mask data register 1424 can store an encoded prefix data bit. The prefix compare circuit 1426 can compare an applied encoded longest prefix value bit to the encoded prefix bit stored in the prefix data register 1424. Complementary prefix value lines 1428-0/1428-1 can supply an encoded longest prefix bit to the prefix compare circuit 1426. Complementary prefix data lines 1430-0/1430-1 can supply an encoded prefix bit to prefix data register 1424. Prefix compare circuit 1426 is coupled to the same match line 1420 as mask circuit 1410.

It is understood that the prefix CAM cell 1402 could also be subject to some variation. As just one example, complementary prefix value lines could provide an encoded longest prefix bit to the prefix compare circuit 1426 as well as an encoded prefix bit to prefix data register 1424. Furthermore, a prefix CAM cell could have a mask register that is loaded with an inactive bit value.

Referring now to FIG. 15, a schematic diagram is set forth illustrating a global prefix/mask arrangement that may be used in second embodiment. The circuit of FIG. 15 can operate in the same general fashion as the global mask arrangement illustrated in FIG. 12, but can receive an encoded prefix value PE as an input, and provide complementary encoded prefix values IPE and PE as outputs.

It is noted that the disclosed embodiments can provide a novel CAM cell array that can provide a longest prefix matching operation without having data values arranged within the array in any particular order. This can allow rapid updates of the novel CAM cell array entries, as new values can be entered without resorting the order of the data values within the array.

One way of conceptualizing the disclosed embodiments is to note that a match line can be discharged (or charged) by comparing an applied comparand value to data words. A match line can be further discharged (or charged) by comparing a longest prefix value (or shortest mask value) to prefix values (mask values) of data words. Prefix (mask) values may be encoded.

While the present invention can be implemented as an integrated circuit, other implementations could include multiple integrated circuits. Further, the present invention could form one portion of a larger integrated circuit (be "embedded").

Accordingly, it is also understood that while various embodiments have been described in detail, it should be understood that the present invention could be subject various changes, substitutions, and alterations without departing from the spirit and scope of the invention. Accordingly, the present invention is intended to be limited only as defined by the appended claims.

What is claimed is:

1. A content addressable memory (CAM) device, comprising:
   a plurality of CAM cells arranged into rows, each row of the CAM cells
      storing a maskable data value that can be compared to an applied comparand value to generate a longest prefix value, and
      storing prefix/mask data for the maskable data word that can be compared to the longest prefix value to generate a match indication for a maskable data word having a longest prefix match with the applied comparand value.

2. The CAM device of claim 1, further including:
   a plurality of match lines; and
   each row of CAM cells is commonly coupled to an associated match line, each row of CAM cells driving its associated match line to first predetermined level when its maskable data value is different than an applied comparand value and when its prefix/mask data for the maskable data word is different than the longest prefix value.

3. The CAM device of claim 1, further including:
   the CAM cells are arranged into columns;
   a plurality of prefix lines, the prefix lines carrying a longest prefix value in response to a comparand value being compared to maskable data values; and
   each column of CAM cells is commonly coupled to an associated prefix line.

4. The CAM device of claim 3, wherein:
   each CAM cell includes
      a data compare circuit that can compare an applied comparand value bit to a stored data value bit and provide a data bit comparison result,
      a mask circuit that can couple the data bit comparison result to the associated match line according to a stored prefix/mask value bit,
      a prefix bit detect circuit that can generate a prefix value on an associated prefix/mask line according to the stored prefix/mask value bit and level of the associated match line, and
      a prefix/mask compare circuit that can compare a longest prefix bit value to the stored prefix/mask value and provide a prefix bit comparison result to the associated match line.

5. The CAM device of claim 1, further including:
   a plurality of match lines;
   an encoder that can receive a longest prefix value and provide an encoded longest prefix value; and
   each row of CAM cells includes
      data CAM cells that are commonly coupled to an associated match line, the data CAM cells driving their associated match line to first predetermined level when their maskable data value is different than an applied comparand value, and
      prefix/mask CAM cells that can store encoded prefix/mask data for their associated data value, the prefix/mask CAM cells of the row being commonly coupled to the associated match line and driving their associated match line to the first predetermined level when their encoded prefix/mask data is different than the encoded longest prefix/mask value.

6. The CAM device of claim 5, further including:
   a plurality of prefix lines that can carry a longest prefix value in response to a comparand value being compared to maskable data values;
   a plurality of encoded prefix lines that can carry the encoded longest prefix value of the encoder;
   each column of data CAM cells is commonly coupled to an associated prefix line; and
   each column of prefix/mask CAM cells is commonly coupled to an associated encoded prefix line.

7. The CAM device of claim 5, wherein:
   each data CAM cell includes
      a data compare circuit that can compare an applied comparand value bit to a stored data value bit and provide a data bit comparison result,
      a mask circuit that can couple the data bit comparison result to the associated match line according to a stored prefix/mask value bit, and
      a prefix bit detect circuit that can generate a prefix value on the associated prefix/mask line according to the stored prefix/mask value bit and level of the associated match line; and
   each prefix/mask CAM cell includes a prefix/mask compare circuit that can compare a longest prefix bit value to the stored prefix/mask value and provide a prefix bit comparison result to the associated match line.

8. A content addressable memory (CAM), comprising:
   a plurality of data CAM cells arranged into rows and columns, the data CAM cells of the same column being commonly coupled to an associated prefix line, the data CAM cells of the same row being commonly coupled to an associated match line, each data CAM cell including
      a data register that can store a data bit,
      a prefix/mask register that can store a prefix/mask bit,
      a data compare circuit that can compare the data bit stored in the data register with a comparand bit,
      a mask circuit that can couple the data compare circuit to its associated match line; and
      a prefix/mask detect circuit that drives its associated prefix line to a predetermined logic level according to a prefix/mask bit stored in the prefix/mask register and a match line voltage level.

9. The CAM of claim 8, wherein:

each prefix/mask detect circuit includes a controllable impedance path disposed between its associated prefix line and the predetermined logic level, the controllable impedance path providing a relatively low impedance when its prefix/mask register stores a particular prefix/ mask bit and its match line is at a particular voltage level.

10. The CAM of claim 9, further including:

a hit line associated with each match line of a row of data CAM cells, each hit line being activated when its associated match line is activated; and each prefix/mask detect circuit includes a first insulated gate field effect transistor (IGFET) and a second IGFET having source-drain paths arranged in series, the gate of the first IGFET being coupled to the hit line of its associated row of data CAM cells, the gate of the second IGFET being coupled to the prefix/mask register of its data CAM cell.

11. The CAM of claim 8, wherein:

the data compare circuit of each CAM cell provides a compare impedance path having a relatively low impedance when its data bit does not match its comparand bit; and the mask circuit of each CAM cell provides a mask impedance path having a relatively low impedance path when the prefix/mask bit has a predetermined logic value.

12. The CAM of claim 8, wherein:

each data CAM cell further includes a prefix/mask compare circuit coupled to the match line of its associated row of CAM cells, the prefix/mask compare circuit comparing the prefix/mask bit stored in the prefix/mask register with a longest prefix value bit.

13. The CAM of claim 8, further including:

a plurality of prefix/mask CAM cells arranged into rows and columns, each row of prefix/mask CAM cells corresponding to a row of data CAM cells, the prefix/ mask CAM cells of the same column being commonly coupled to an associated longest prefix/bit line, the prefix/mask CAM cells of the same row being commonly coupled to the associated match line of their corresponding row of data CAM cells, each prefix/ mask CAM cell including an encoded prefix/mask register that can store an encoded prefix/mask bit, and an encoded prefix/mask compare circuit coupled to its associated match line, the encoded prefix/mask compare circuit comparing the encoded prefix/mask bit stored in the encoded prefix/mask register with an encoded longest prefix value bit.

14. The CAM of claim 13, further including:

an encoder that can receive a longest prefix value from the prefix bit lines and generate an encoded longest prefix value therefrom.

15. A method of longest prefix matching, comprising the steps of:

storing a plurality of maskable data values;

storing prefix/mask data values for the stored maskable data values;

comparing the maskable data values with a comparand value to generate ternary match indications;

determining a longest prefix value from ternary match indications; and comparing the prefix/mask data values with a longest prefix value to determine a maskable data value having a longest prefix match with the comparand value.

16. The method of claim 15, wherein:

the step of storing prefix/mask data values includes storing a prefix/mask bit corresponding to each maskable data value bit.

17. The method of claim 16, wherein:

the step of storing prefix/mask data values further includes storing encoded values representing the prefix of corresponding maskable data values;

the step of determining a longest prefix value includes determining a binary longest prefix value and encoding the binary longest prefix value to generate an encoded longest prefix value; and the step of comparing the stored prefix/mask data values with a longest prefix value includes comparing stored encoded prefix/mask data values with an encoded longest prefix value.

18. The method of claim 15, wherein:

the step of storing a plurality of maskable data values includes storing data values in an array of CAM cells having rows and columns, each CAM cell storing a mask/prefix bit; and the step of determining a longest prefix value includes logically combining the mask/prefix bits of CAM cells of the same column.

19. The method of claim 18, wherein:

logically combining the mask/prefix bit of CAM cells of the same column includes providing a prefix line for each column of CAM cells, establishing a first logic level on the prefix lines, driving a prefix line to a second logic level when a CAM cell of its corresponding column of CAM cells includes a prefix/mask bit of a predetermined value, and stores a data bit of a maskable data value having a ternary match indication with the comparand value.

20. The method of claim 15, wherein:

the step of comparing the maskable data values with a comparand value includes providing a match line for each maskable data value, precharging the match line to a first logic level, and driving the match line to a second logic level when its maskable data value is different than the comparand value; and the step of comparing the prefix/mask data values with a longest prefix value includes driving the match line of a data value having a ternary match indication to the second logic level when its corresponding prefix/mask value is different than the longest prefix value.

* * * * *